(12) United States Patent
Kim et al.

(10) Patent No.: US 11,942,162 B2
(45) Date of Patent: Mar. 26, 2024

(54) MEMORY DEVICE AND A METHOD FOR OPERATING THE SAME

(71) Applicant: SAMSUNG ELECTRONICS CO., LTD., Suwon-si (KR)

(72) Inventors: Hyung Soo Kim, Seoul (KR); Dae Han Kim, Seoul (KR); Jong Min Kim, Hwaseong-si (KR); Myoung Won Yoon, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 154 days.

(21) Appl. No.: 17/736,250

(22) Filed: May 4, 2022

(65) Prior Publication Data

US 2023/0067813 A1  Mar. 2, 2023

(30) Foreign Application Priority Data

Aug. 27, 2021 (KR) .......................... 10-2021-0113877

(51) Int. Cl.
| | | |
|---|---|---|
| *G11C 16/34* | (2006.01) | |
| *G11C 16/04* | (2006.01) | |
| *G11C 16/08* | (2006.01) | |
| *G11C 16/24* | (2006.01) | |
| *G11C 29/12* | (2006.01) | |

(52) U.S. Cl.
CPC .......... *G11C 16/24* (2013.01); *G11C 16/0483* (2013.01); *G11C 16/08* (2013.01); *G11C 29/12005* (2013.01)

(58) Field of Classification Search
CPC .................................................. G11C 16/3404
See application file for complete search history.

(56) References Cited

U.S. PATENT DOCUMENTS

| | | | |
|---|---|---|---|
| 6,828,852 B2 | 12/2004 | Klass et al. | |
| 2012/0069666 A1* | 3/2012 | Fukuda .............. | G11C 16/3404 |
| | | | 365/185.12 |

FOREIGN PATENT DOCUMENTS

| | | |
|---|---|---|
| JP | 2001-015717 | 1/2001 |
| KR | 10-2003-0040071 | 5/2003 |
| KR | 10-2005-0063203 | 6/2005 |
| KR | 10-0757934 | 9/2007 |
| KR | 10-0833448 | 5/2008 |
| KR | 10-2011-0109553 | 10/2011 |

* cited by examiner

*Primary Examiner* — Jason Lappas
(74) *Attorney, Agent, or Firm* — CHAU & ASSOCIATES, LLC

(57) ABSTRACT

A method for operating a memory device is provided. The method includes providing a high voltage signal to a memory cell array including a plurality of memory cells using a first wiring, providing a logic signal to the memory cell array using a second wiring, and providing a shielding signal to the memory cell array using a third wiring arranged between the first wiring and the second wiring. A highest voltage level of the logic signal is lower than a highest voltage level of the high voltage signal, and the shielding signal includes a negative first voltage level in a first mode and a positive second voltage level in a second mode.

20 Claims, 13 Drawing Sheets

MEMORY DEVICE AND A METHOD FOR OPERATING THE SAME

CROSS-REFERENCE TO RELATED APPLICATIONS

This application claims priority under 35 U.S.C. § 119 to Korean Patent Application No. 10-2021-0113877 filed on Aug. 27, 2021 in the Korean Intellectual Property Office, the disclosure of which is incorporated by reference herein in its entirety.

TECHNICAL FIELD

Embodiments of the present inventive concept relate to a memory device, and more specifically to a memory device and a method for operating the same.

DISCUSSION OF RELATED ART

As the demand for high performance, high speed, and/or multi-functionality of semiconductor devices increases, so does the degree of integration of semiconductor memory devices. However, with increased integration comes increased coupling (transfer of energy) between wirings inside the semiconductor memory devices.

SUMMARY

At least one embodiment of the inventive concept provides a memory device having improved integration and reliability. At least one embodiment of the inventive concept provides a method for operating a memory device having improved integration and reliability.

According to at least one embodiment of the inventive concept, a memory device is provided. The memory device includes a memory cell block connected between a common source line and a bit line. The memory cell block includes a plurality of NAND strings. Each NAND string of the plurality of NAND strings includes a string selection transistor, a plurality of memory cells, and a ground selection transistor. The memory device further includes a voltage generating circuit generating a high voltage signal, a shielding signal, and a logic signal for the memory cell block, a row decoder connected to the memory cell block through a word line, a page buffer connected to the memory cell block through the bit line, a peripheral circuit including a shielding signal switching circuit and a control logic circuit controlling the voltage generating circuit, the row decoder, and the page buffer, a first wiring providing the high voltage signal to the memory cell block, a second wiring providing the logic signal to the memory cell block, and a third wiring providing the shielding signal to the memory cell block. The shielding signal switching circuit applies the shielding signal to the third wiring at a first voltage level in a first mode, and applies the shielding signal to the third wiring at a second voltage level different from the first voltage level in a second mode. According to at least one embodiment of the inventive concept, a memory device is provided. The memory device includes a memory cell block connected between a common source line and a bit line. The memory cell block includes a plurality of NAND strings. Each NAND string of the plurality of NAND strings includes a string selection transistor, a plurality of memory cells, and a ground selection transistor. The memory device further includes a voltage generating circuit generating a high voltage signal, a shielding signal, and a logic signal for the memory cell block, a row decoder connected to the memory cell block through a word line, a page buffer connected to the memory cell block through the bit line, a peripheral circuit including a level shifter and a control logic circuit controlling the voltage generating circuit, the row decoder, and the page buffer, a first wiring providing the high voltage signal to the memory cell block, a second wiring providing the logic signal to the memory cell block; and a third wiring providing the shielding signal to the memory cell block. The level shifter receives a first voltage including a negative voltage level, a second voltage including a positive voltage level, and a third voltage including a positive voltage level different from the second voltage level, applies the first voltage to the third wiring in response to a control signal including a first voltage level in a test mode, and applies a second voltage to the third wiring in response to a control signal including a second voltage level in a user mode.

According to at least one embodiment of the inventive concept, a method for operating a memory device is provided. The method includes providing a high voltage signal to a memory cell array including a plurality of memory cells using a first wiring, providing a logic signal to the memory cell array using a second wiring, and providing a shielding signal to the memory cell array using a third wiring arranged between the first wiring and the second wiring. A highest voltage level of the logic signal is lower than a highest voltage level of the high voltage signal, and the shielding signal includes a negative first voltage level in a first mode and a positive second voltage level in a second mode.

BRIEF DESCRIPTION OF THE DRAWINGS

The above and other features of the inventive concept will become more apparent by describing in detail embodiments thereof with reference to the accompanying drawings, in which.

DETAILED DESCRIPTION

Embodiments of the present inventive concept will be described more fully hereinafter with reference to the accompanying drawings.

It will be understood that when an element or layer is referred to as being "over," "above," "on," "below," "under," "beneath," "connected to" or "coupled to" another element or layer, it can be directly over, above, on, below, under, beneath, connected or coupled to the other element or layer or intervening elements or layers may be present.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer, or section. Thus, a first element, component, region, layer, or section discussed below could be termed a second element, component, region, layer, or section without departing from the teachings of the embodiments.

As used herein, the singular forms "a," "an" and "the" are intended to include the plural forms as well, unless the context clearly indicates otherwise.

Herein, when one value is described as being about equal to another value or being substantially the same as or equal to another value, it is to be understood that the values are equal to each other to within a measurement error, or if measurably unequal, are close enough in value to be functionally equal to each other as would be understood by a person having ordinary skill in the art. For example, the term "about" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations as understood by one of the ordinary skill in the art. Further, it is to be understood that while parameters may be described herein as having "about" a certain value, according to exemplary embodiments, the parameter may be exactly the certain value or approximately the certain value within a measurement error as would be understood by a person having ordinary skill in the art.

Figure 1:
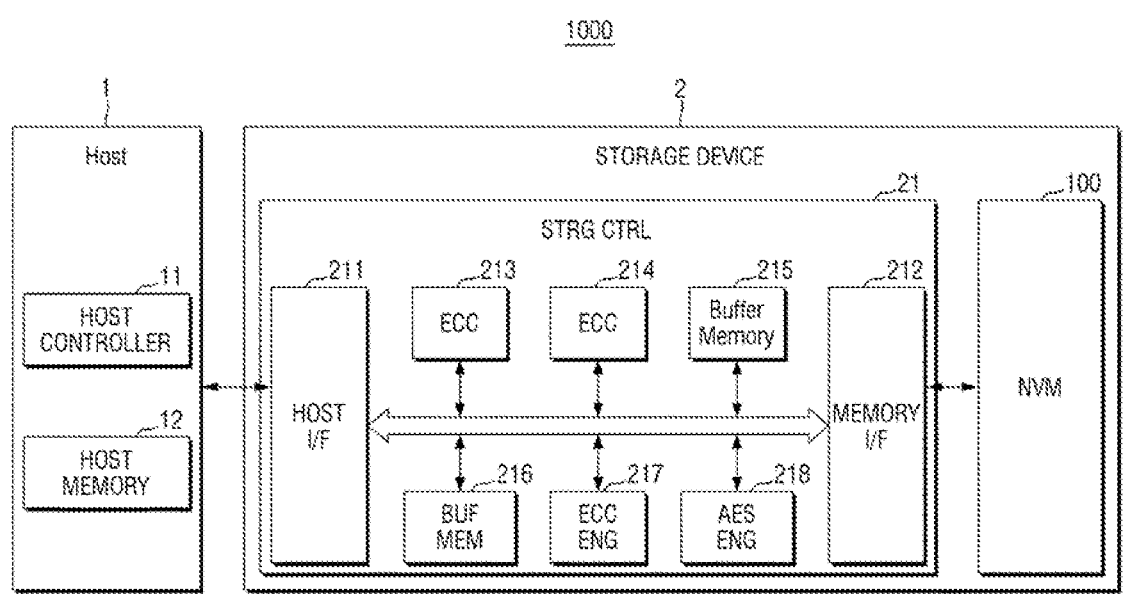
FIG. 1 is a diagram of a memory system including a memory device according to at least one embodiment of the inventive concept.

FIG. 1 is a diagram of a memory system including a memory device according to at least one embodiment of the inventive concept.

Referring to FIG. 1, a memory system 1000 may include a host 1 and a storage device 2. The storage device 2 may include a storage controller 21 and a memory device 100.

In at least one embodiment, the memory device 100 includes a non-volatile memory NVM. In at least one embodiment, the memory device 100 includes a volatile memory. The memory device 100 will be described in further detail with reference to FIGS. 2 to 4.

A host 1 may include a host controller 11 and a host memory 12. The host memory 12 may function as a buffer memory for temporarily storing data to be transmitted to the storage device 2 or data provided from the storage device 2.

The storage device 2 may include at least one storage medium for storing data in response to a request from the host 1. For example, the storage device 2 may include at least one of a solid state drive (SSD), an embedded memory, and a detachable external memory.

In at least one embodiment, the storage device 2 includes an SSD, and the storage device 2 is a device that complies with a non-volatile memory express (NVMe) standard. In at least one embodiment, the storage device 2 includes an embedded memory or an external memory, and the storage device 2 is a device that complies with a universal flash storage (UFS) standard or an embedded multi-media card (eMMC) standard. The host 1 and the storage device 2 may each generate and transmit packets according to an adopted standard protocol.

In at least one embodiment, the memory device 100 of the storage device 2 includes a flash memory, and the flash memory includes a 2D NAND memory array or a 3D (or vertical) NAND (VNAND) memory array. The storage device 2 may include various types of non-volatile memories. For example, the storage device 2 may include a magnetic RAM (MRAM), spin-transfer torque MRAM, a conductive bridging RAM (CBRAM), a ferroelectric RAM (FeRAM), a phase RAM (PRAM), a resistive memory (resistive RAM), and various other types of non-volatile memories.

In at least one embodiment, the host controller 11 and the host memory 12 are implemented as separate semiconductor chips. In at least one embodiment, the host controller 11 and the host memory 12 are integrated on a same semiconductor chip. For example, the host controller 11 may be one of a plurality of modules provided in an application processor, and the application processor may be implemented as a system on a chip (SoC). Also, the host memory 12 may be implemented as an embedded memory provided inside the application processor, as a non-volatile memory, or as a memory module disposed outside of the application processor.

The host controller 11 may manage an operation of storing data (for example, recorded data) of a buffer area of the host memory 12 in the memory device 100. The host controller 11 may manage an operation of storing data (for example, read data) of the memory device 100 in the buffer area.

The storage controller 21 may include a host interface 211, a memory interface 212, a central processing unit (CPU) 213, a flash translation layer (FTL) 214, a packet manager 215, a buffer memory 216, an error correction code (ECC) engine 217, an advanced encryption standard (AES) engine 218, and a working memory. The FTL 214 may be loaded into the working memory, and a data program and a read operation of the memory device 100 may be controlled when the CPU 213 executes the FTL 214.

The host interface 211 may transmit and receive packets to and from the host 1. Packets transmitted from the host 1 to the host interface 211 may include one or more commands or data to be recorded in the memory device 100, and packets transmitted from the host interface 211 to the host 1 may include a response to the command, data that are read from the memory device 100, and the like.

The memory interface 212 may transmit data to be recorded in the memory device 100 to the memory device 100 or may receive data read from the memory device 100.

The memory interface 212 may be implemented to comply with standard conventions such as Toggle or Open NAND Flash Interface (ONFI).

The FTL 214 may perform various operations such as address mapping, wear-leveling, and garbage collection. The address mapping operation changes a logical address received from the host 1 into a physical address that is used for storing data in the memory device 100. The wear-leveling operation ensures that memory cell blocks in the memory device 100 are uniformly used, thereby preventing an excessive deterioration of a particular memory cell block, and may be implemented through a firmware technique that balances erasure counts of the physical memory cell blocks. The garbage collection operation ensures an available capacity in the memory device 100 by copying valid data of a memory cell block to a new memory cell block and then erasing the memory cell block.

The packet manager 215 may generate a packet according to the interface protocol of the host 1, or may parse various types of information from the packet received from the host 1. The buffer memory 216 may temporarily store the data to be recorded in the memory device 100 or the data to be read from the memory device 100. In at least one embodiment, the buffer memory 216 is provided inside the storage controller 21. In at least one embodiment, the buffer memory 216 is provided outside of the storage controller 21.

The ECC engine 217 may perform an error detection function and a correction function on read data that are read from the memory device 100. For example, the ECC engine 217 may generate parity bits on the write data to be written on the memory device 100, and the parity bits thus generated may be stored in the memory device 100 together with the program data. When reading the data from the memory device 100, the ECC engine 217 may correct an error of the read data using the parity bits that are read from the memory device 100 together with the read data, and output the read data with a corrected error.

The AES engine 218 may perform at least one of an encryption operation and a decryption operation of the data that are input to the storage controller 21. The AES engine 218 may perform the encryption operation and/or the decryption operation using a symmetric-key algorithm.

Figure 2:
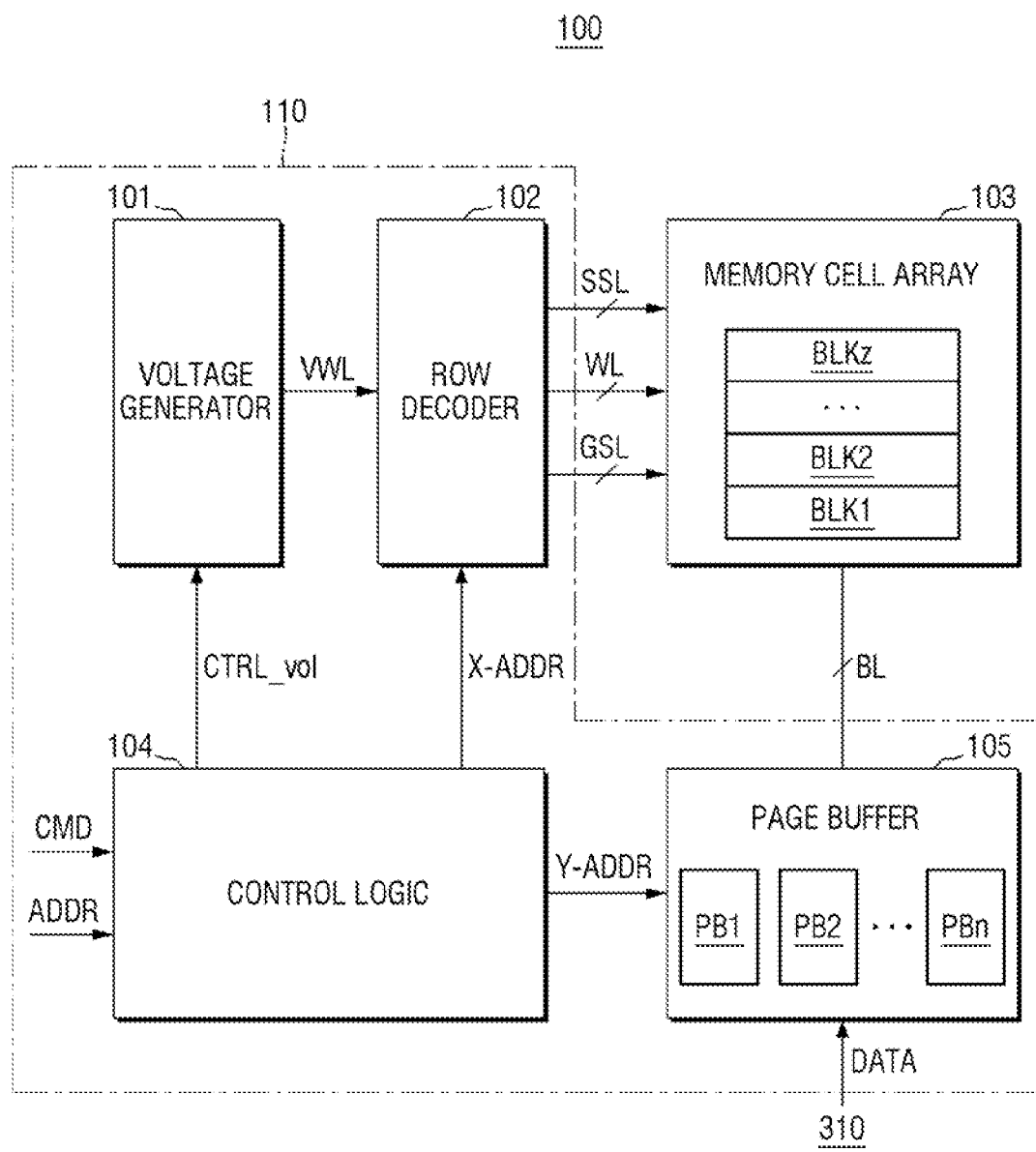
FIG. 2 is a diagram of a memory device according to at least one embodiment of the inventive concept.

FIG. 2 is a diagram of a memory device according to at least one embodiment of the inventive concept.

Referring to FIG. 2, the memory device 100 may include a memory cell array 103 and a peripheral circuit 110. The peripheral circuit 110 may include a voltage generator 101, a row decoder 102, a memory cell array 103, a control logic circuit 104, and a page buffer 105. The peripheral circuit 110 may further include an input/output interface, a column logic, a pre-decoder, a temperature sensor, a command decoder, an address decoder, an amplifier circuit, and the like.

Figure 10:
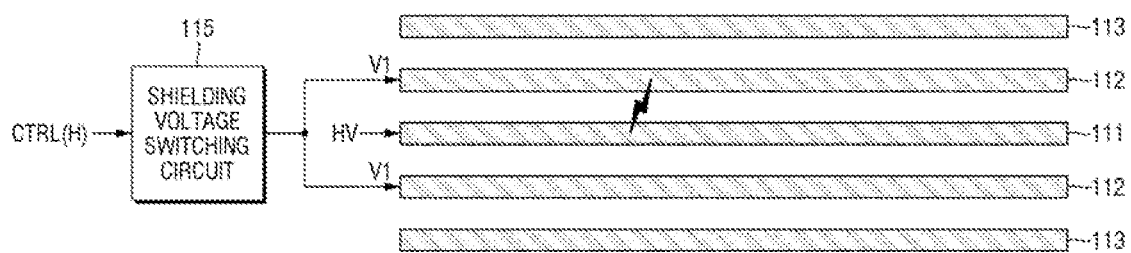
FIG. 10 is a diagram for explaining the operation of a memory device according to at least one embodiment of the inventive concept.

The voltage generator 101 may generate various voltages, based on the voltage control signal, for performing program, read, and erasure operations. For example, the voltage generator 101 may generate a program voltage, a read voltage, a program verification voltage, an erasure voltage, and the like, as a word line voltage VWL. Referring to FIG. 10, the voltage generator 101 may generate a high voltage HV applied to the high voltage transfer line 111 of the peripheral circuit 110 and may generate a first voltage V1 and a second voltage V2 applied to a shielding line 112 of the peripheral circuit 110.

The row decoder 102 may select one of a plurality of word lines WL, and may select one of a plurality of string selection lines SSL in response to the row address X-ADDR. For example, the row decoder 102 may apply the program voltage and the program verification voltage to the selected word line at the time of the program operation. As another example, the row decoder 102 may apply the read voltage to the selected word line at the time of the read operation.

The memory cell array 103 may include a plurality of memory cell blocks BLK1 to BLKz, where z is a positive integer. Each memory cell block of the plurality of memory blocks BLK1 to BLKz may include a plurality of memory cells. The memory cell array 103 may be connected to the page buffer 105 through the bit lines BL. The memory cell array 103 may be connected to the row decoder 102 through the plurality of word lines WL, string selection lines SSL, and ground selection lines GSL.

The control logic circuit 104 may generally control various operations inside the memory device 100. The control logic circuit 104 may output various control signals in response to the command CMD and/or the address ADDR received from the memory interface 212. For example, the control logic circuit 104 may output a voltage control signal CTRL_vol, a row address X-ADDR, and a column address Y-ADDR.

The page buffer 105 may include a plurality of page buffers PB1 to PBn, where n is an integer equal to or greater than 3, and each page buffer of the plurality of page buffers PB1 to PBn may be connected to the memory cells through the bit lines BL. The page buffer 105 may select at least one bit line among the bit lines BL in response to the column address Y-ADDR. The page buffer 105 may operate as a write driver or as a sense amplifier, depending on an operating mode. For example, at the time of a program operation, the page buffer 105 may apply a bit line voltage corresponding to the data to be programmed to the selected bit line. At the time of a read operation, the page buffer 105 may sense the current or voltage of the selected bit line and detect the data stored in the memory cell.

Figure 3:
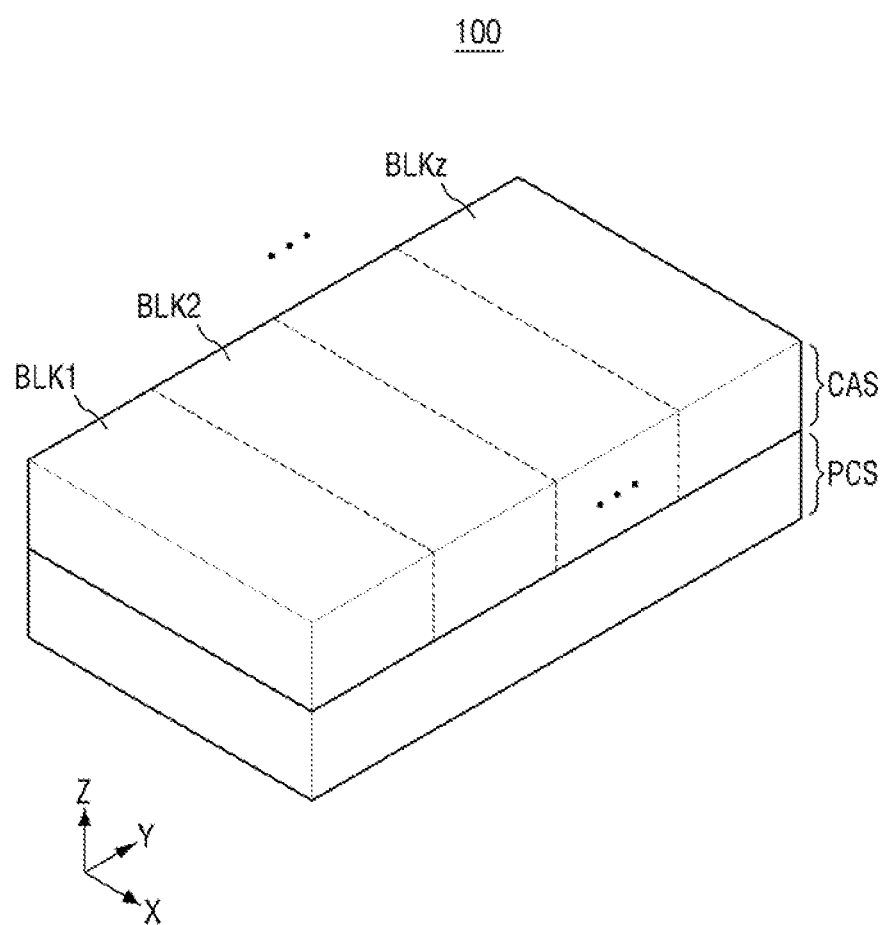
FIG. 3 is a perspective view of a memory device according to at least one embodiment of the inventive concept.

FIG. 3 is a perspective view of a memory device according to at least one embodiment of the inventive concept.

Referring to FIG. 3, in at least one embodiment, the memory device 100 includes a cell array structure CAS and a peripheral circuit structure PCS. The cell array structure CAS may include the memory cell array 103 described with reference to FIG. 2. The peripheral circuit structure PCS may include the peripheral circuit 110 described with reference to FIG. 2. The cell array structure CAS may include at least one mat MAT, and the mat MAT may include the plurality of memory cell blocks BLK1 to BLKz. Each memory cell block of the plurality of memory cell blocks BLK1 to BLKz may include memory cells arranged three-dimensionally. In at least one embodiment, the memory device 100 includes a cell-on-peri (COP) structure. For example, the cell array structure CAS and the peripheral circuit structure PCS may overlap each other (e.g., be stacked) in a vertical direction (e.g., a Z direction).

Figure 4:
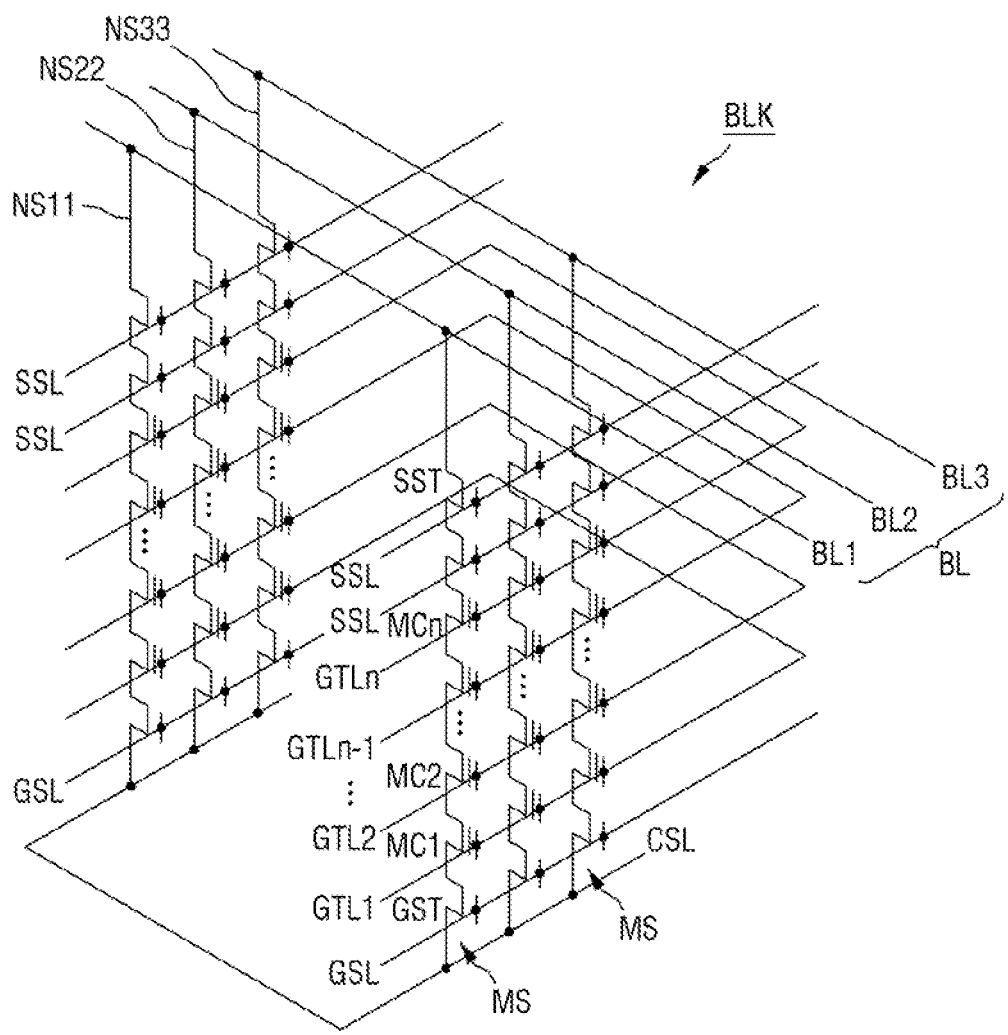
FIG. 4 is an equivalent circuit diagram of a memory cell array of a memory device according to at least one embodiment of the inventive concept.

FIG. 4 is an equivalent circuit diagram of a memory cell array of a memory device according to at least one embodiment of the inventive concept.

Referring to FIG. 4, the memory cell block BLK of the plurality of memory cell blocks BLK1 to BLKZ described with reference to FIG. 2 is a three-dimensional memory cell block arranged as a three-dimensional structure on a substrate. For example, a plurality of memory NAND strings included in the memory cell block BLK may extend in a direction perpendicular to a direction that the substrate extends in.

The memory cell block BLK may include NAND strings NS11 to NS33 of the plurality of memory NAND strings respectively connected between bit lines BL1, BL2 and BL3 of the bit lines BL and a common source line CSL. Each of the NAND strings NS11 to NS33 may include a string selection transistor SST, a plurality of memory cells MC1 to MCn, and a ground selection transistor GST. In at least one embodiment of the inventive concept, each of the NAND strings NS11 to NS33 includes eight memory cells MC1 to MC8.

The string selection transistor SST may be connected to corresponding string selection lines of the plurality of string selection lines SSL. In at least one embodiment, the string selection transistor SST is connected to three corresponding string selection lines. Memory cells of the plurality of memory cells MC1 to MCn may be connected to corresponding gate lines GTL1 to GTLn, respectively. In at least one embodiment, the memory cell block includes eight gate lines GTL1 to GTL8. The gate lines GTL1 to GTLn correspond to word lines, and at least one of the gate lines GTL1 to GTLn may correspond to a dummy word line. The ground selection transistor GST may be connected to corresponding ground selection lines GSL. In at least one embodiment, the ground selection transistor GST is connected to three corresponding gate lines. The string selection transistor SST may be connected to the corresponding bit lines BL1, BL2, and BL3, and the ground selection transistor GST may be connected to the common source line CSL.

Word lines of the same height are commonly connected, and the ground selection lines GSL and string selection lines of the plurality of string selection lines SSL may be separated, respectively. In at least one embodiment, the memory cell block BLK is connected to eight gate lines GTL1 to GTL8 and three bit lines BL1, BL2, and BL3.

Figure 5:
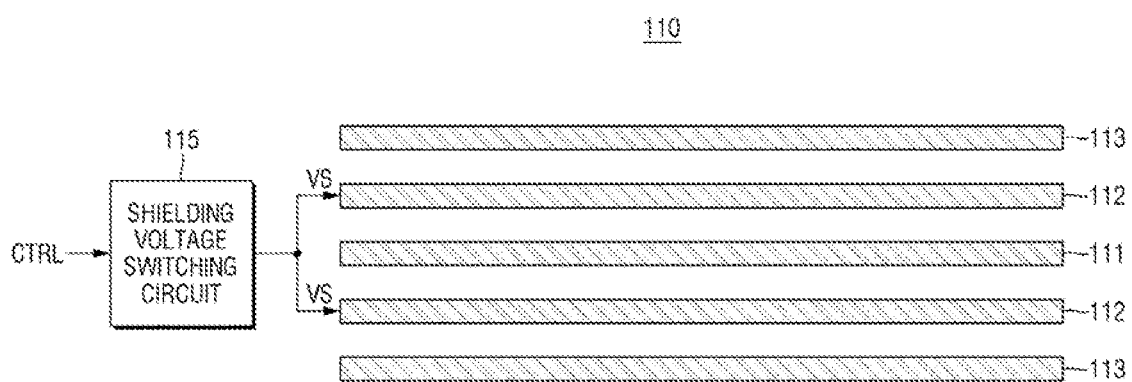
FIG. 5 is a diagram of the structure of a peripheral circuit of a memory device according to at least one embodiment of the inventive concept.

FIG. 5 is a diagram of the structure of a peripheral circuit of a memory device according to at least one embodiment of the inventive concept.

Referring to FIG. 5, the peripheral circuit 110 of the memory device 100 may include a high voltage transfer line 111, a shielding line 112, a logic signal line 113, and a shielding voltage switching circuit 115.

The high voltage transfer line 111 may include wiring for transmitting a high voltage. The high voltage transfer line 111 may transfer a high voltage to a word line WL of the memory cell array 103. For example, the high voltage transmitted by the high voltage transfer line 111 to the word line WL may include a program voltage for storing data in the memory cell array 103 during a program operation. In another example, the high voltage transmitted by the high voltage transfer line 111 to the word line WL may include an erase voltage for erasing data during an erase operation. A voltage level of a high voltage transmitted by the high voltage transfer line 111 to the word line WL may be variously changed depending on an operation of the memory cell array.

The shielding line 112 may be arranged between the high voltage transfer line 111 and the logic signal line 113, and may therefore reduce a coupling between the high voltage transfer line 111 and the logic signal line 113. A voltage level of the shielding voltage applied to the shielding line 112 may be lower than a voltage level of the high voltage applied to the high voltage transfer line 111 and higher than a voltage level of the logic signal voltage applied to the logic signal line 113.

The logic signal line 113 may transmit a logic signal for one or more operations of the memory device 100. For example, the logic signal line 113 may transmit a logic high (1) or logic low (0) signal. In at least one embodiment, the logic signal includes a voltage level of from about 0V to about 10V.

The shielding voltage switching circuit 115 may apply a variable voltage to the shielding line 112. The shielding voltage switching circuit 115 may apply another voltage to the shielding line 112 in response to the control signal CTRL (e.g., the voltage control signal CTRL_vol). The shielding voltage switching circuit 115 will be described in further detail with reference to FIGS. 6 to 12.

Figure 6:
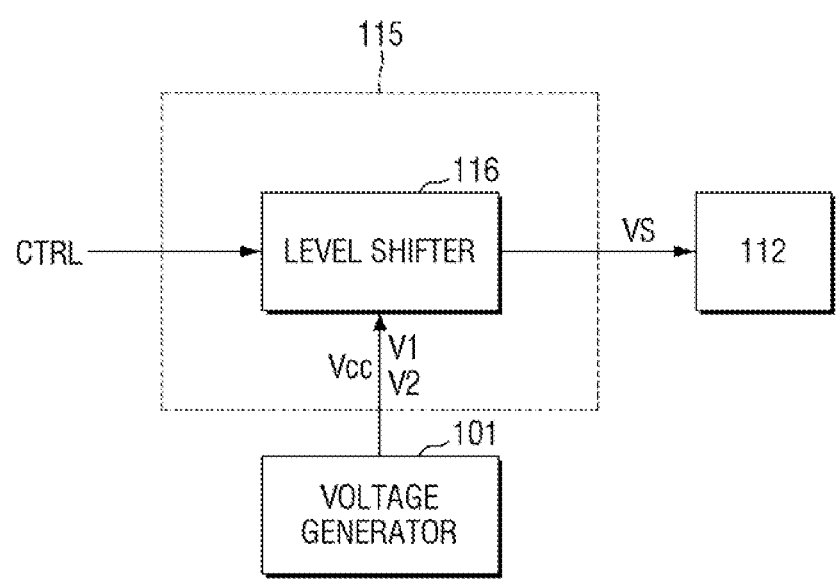
FIG. 6 is a diagram of a shielding voltage switching circuit of FIG. 5.

FIG. 6 is a diagram of the shielding voltage switching circuit of FIG. 5.

Referring to FIG. 6, the shielding voltage switching circuit 115 may include a level shifter 116. The shielding voltage switching circuit 115 may apply the shielding voltage VS to the shielding line 112 via the level shifter 116. The level shifter 116 may receive the control signal CTRL as an input signal. The level shifter 116 may receive a first voltage V1 and/or a second voltage V2 from the voltage generator 101. In at least one embodiment, the first voltage V1 includes a voltage level that is different from a voltage level of the second voltage V2. The level shifter 116 may apply the shielding voltage VS to the shielding line 112 in response to receiving the control signal CTRL. In at least one embodiment, a voltage level of the shielding voltage VS corresponds to a voltage level of the first voltage V1 or the second voltage V2 that are received from the voltage generator 101. For example, the voltage level of the shielding voltage VS may be equal to a voltage level of the first voltage V1 or the second voltage V2.

Figure 7:
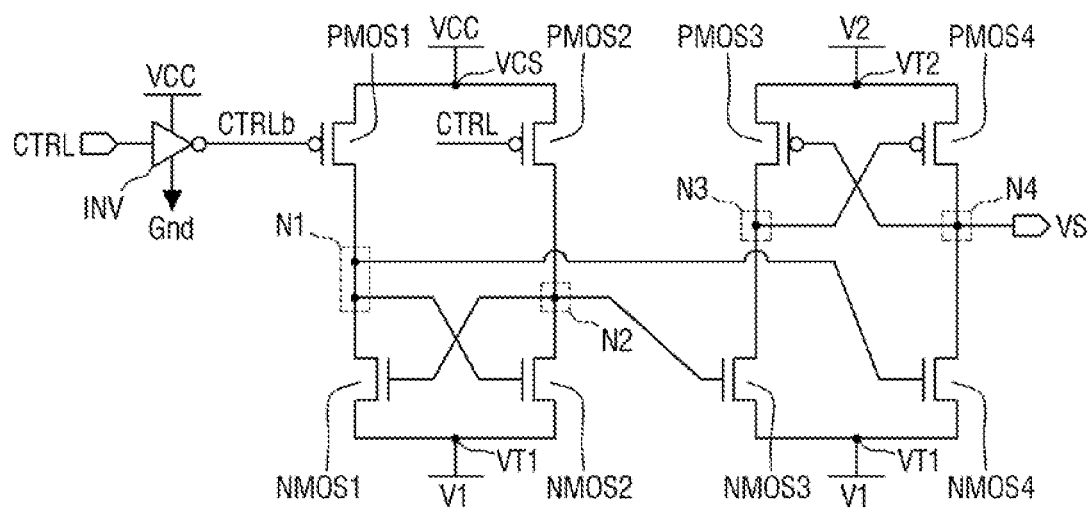
FIG. 7 is a diagram of an internal circuit of the level shifter of FIG. 6.

FIG. 7 is a diagram of an internal circuit of the level shifter of FIG. 6.

Referring to FIG. 7, in at least one embodiment, the level shifter 116 includes an inverter INV, first to fourth PMOS transistors PMOS1 to PMOS4, first to fourth NMOS transistors NMOS1 to NMOS4, and first to fourth nodes N1 to N4. In at least one embodiment, the level shifter 116 includes various forms of internal circuit configurations that may output different levels of signals to the shielding line 112 according to the input signal.

The inverter INV may transition a voltage level of an input control signal CTRL and output the complementary signal CTRLb to the first PMOS transistor. For example, the inverter INV may receive a control signal CTRL including a logic high voltage level H. The inverter INV may transition the logic high voltage level to a logic low voltage level L such that a complimentary signal CTRLb that includes the logic low voltage level L and does not include the logic high voltage level H is generated and may provide the complementary signal CTRLb including the logic low voltage level L to the first PMOS transistor. In another example, the inverter INV may receive a control signal CTRL including a logic low level L and may similarly transition the logic low voltage level L to the logic high voltage level H and provide the a complementary signal CTRLb including the logic high voltage level H to the first PMOS transistor.

A power supply voltage VCC may be applied by a power supply to the inverter INV and to the first PMOS transistor PMOS1 and the second PMOS transistor PMOS2 via a power supply voltage terminal VCS. A second voltage V2 may be applied to the third PMOS transistor PMOS3 and the fourth PMOS transistor PMOS4.

A gate terminal of the first PMOS transistor PMOS1 may be connected to the inverter INV. The complementary CTRLb of the control signal CTRL may be input to the gate terminal of the first PMOS transistor PMOS1 from the inverter INV. A first source/drain terminal (e.g., a source terminal) of the first PMOS transistor PMOS1 may be connected to the power supply voltage terminal VCS. A second source/drain terminal (e.g., a drain terminal) of the first PMOS transistor PMOS1 may be connected to the first node N1. For example, the first PMOS transistor PMOS1 may be connected to the first NMOS transistor NMOS1 through the first node N1.

The control signal CTRL may be input to the gate terminal of the second PMOS transistor PMOS2. A first source/drain terminal of the second PMOS transistor PMOS2 may be connected to the power supply voltage terminal VCS. A second source/drain terminal of the second PMOS transistor PMOS2 may be connected to the second node N2. For example, the second PMOS transistor PMOS2 may be connected to the second NMOS transistor NMOS2 through the second node N2.

A gate terminal of the third PMOS transistor PMOS3 may be connected to the fourth node N4. A first source/drain terminal of the third PMOS transistor PMOS3 may be connected to a second voltage terminal VT2. A second source/drain terminal of the third PMOS transistor PMOS3 may be connected to the third node N3. For example, the third PMOS transistor PMOS3 may be connected to the third NMOS transistor NMOS3 through the third node N3.

The first source/drain terminal of the fourth PMOS transistor PMOS4 may be connected to the second voltage terminal VT2. The second source/drain terminal of the fourth PMOS transistor PMOS4 may be connected to the fourth node N4. The gate terminal of the fourth PMOS transistor PMOS4 may be connected to the third node N3.

The first voltage V1 may be applied to the first to fourth NMOS transistors NMOS1 to NMOS4.

The first source/drain terminal of the first NMOS transistor NMOS1 may be connected to a first voltage terminal VT1. The second source/drain terminal of the first NMOS transistor NMOS1 may be connected to the first node N1. The gate terminal of the first NMOS transistor NMOS1 may be connected to the second node N2.

The first source/drain terminal of the first NMOS transistor NMOS1 may be connected to the first voltage terminal VT1. The second source/drain terminal of the first NMOS transistor NMOS1 may be connected to the first node N1. The gate terminal of the first NMOS transistor NMOS1 may be connected to the second node N2.

The first source/drain terminal of the second NMOS transistor NMOS2 may be connected to the first voltage terminal VT1. The second source/drain terminal of the second NMOS transistor may be connected to the second node N2. The gate terminal of the second NMOS transistor NMOS2 may be connected to the first node N1.

The first source/drain terminal of the third NMOS transistor NMOS3 may be connected to the first voltage terminal VT1. The second source/drain terminal of the third NMOS transistor NMOS may be connected to the third node N3. The gate terminal of the third NMOS transistor NMOS3 may be connected to the second node N2.

The first source/drain terminal of the fourth NMOS transistor NMOS4 may be connected to the first voltage terminal VT1. The second source/drain terminal of the fourth NMOS transistor NMOS4 may be connected to the fourth node N4. The gate terminal of the fourth NMOS transistor NMOS4 may be connected to the first node N1.

The fourth node N4 may be connected to the shielding line 112. For example, the level shifter 116 may apply a shielding voltage VS to the shielding line 112 through the fourth node N4.

Figure 8:
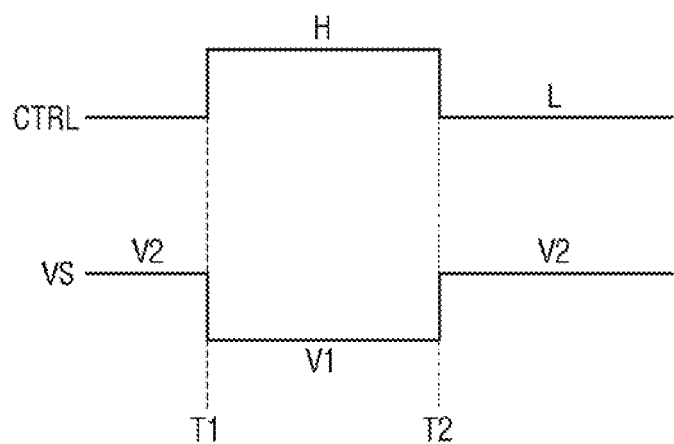
FIG. 8 is a timing diagram for explaining the operation of a memory device according to at least one embodiment of the inventive concept.
Figure 9:
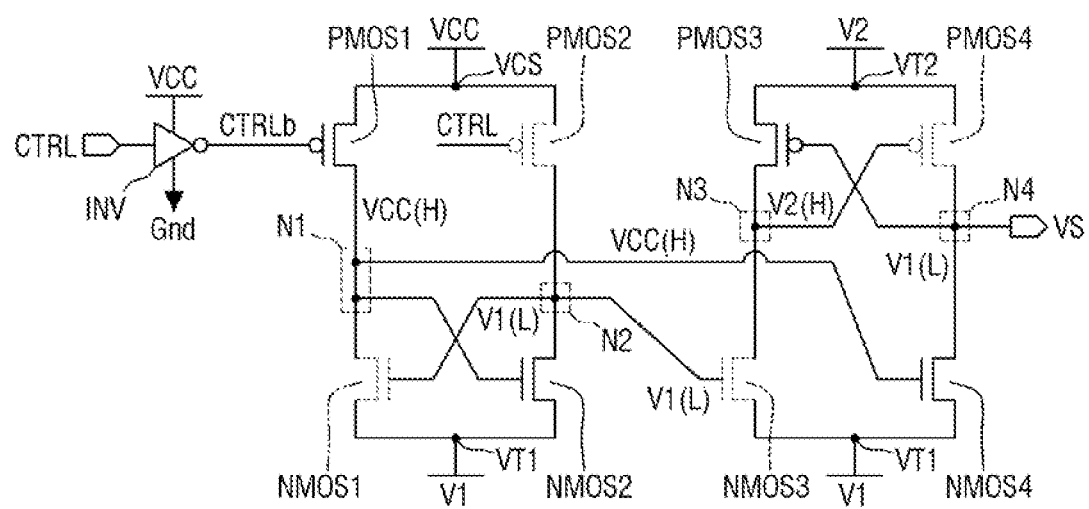
FIG. 9 is a circuit diagram for explaining the operation of a level shifter of a memory device according to at least one embodiment of the inventive concept to which a control signal including a logic high voltage level is input.
Figure 11:
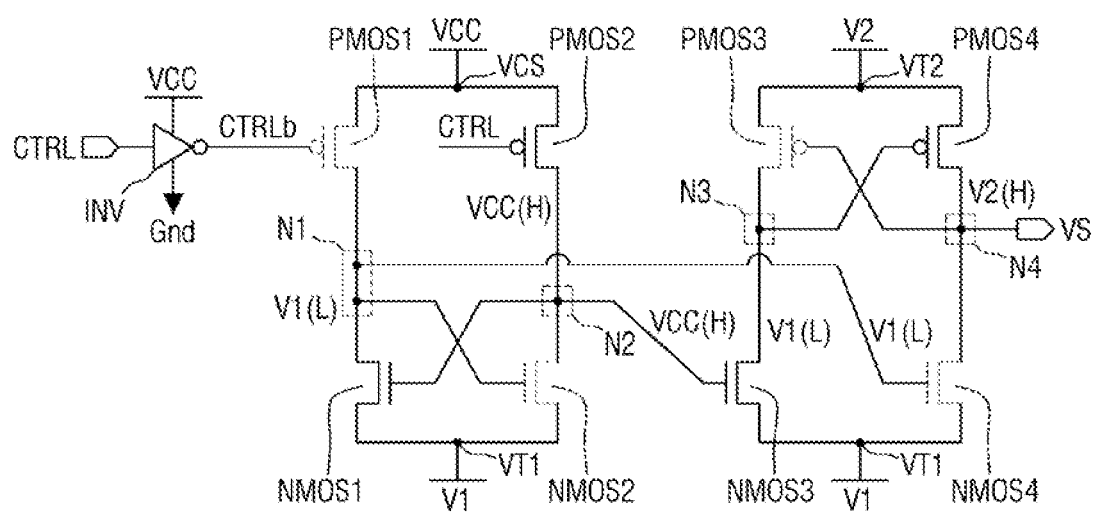
FIG. 11 is a circuit diagram for explaining the operation of a level shifter of a memory device according to at least one embodiment of the inventive concept to which a control signal including a logic low voltage level is input.
Figure 12:
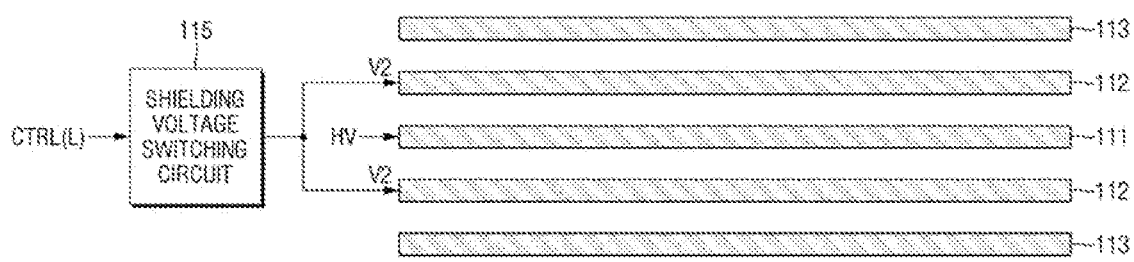
FIG. 12 is a diagram for explaining the operation of a memory device according to at least one embodiment of the inventive concept.

FIG. 8 is a timing diagram for explaining the operation of a memory device according to at least one embodiment of the inventive concept. FIG. 9 is a circuit diagram for explaining the operation of a level shifter of a memory device according to at least one embodiment of the inventive concept to which a control signal including a logic high voltage level is input. FIG. 10 is a diagram for explaining the operation of a memory device according to at least one embodiment of the inventive concept. FIG. 11 is a circuit diagram for explaining the operation of a level shifter of a memory device according to at least one embodiment of the inventive concept to which a control signal including a logic low level is input. FIG. 12 is a diagram for explaining the operation of the memory device according to at least one embodiment of the inventive concept.

Referring to FIGS. 8 to 10, a voltage level of the control signal CTRL may transition from a logic low level L to a logic high level H at a time point T1. In a first mode (e.g., a test mode), at the time point T1, the control signal CTRL including the logic high level H may be input to the level shifter 116. The first mode (e.g., the test mode) is described hereinafter.

The inverter INV may receive the control signal CTRL including the logic high level H and may provide the complementary signal CTRLb of the control signal CTRL, where the complementary signal CTRLb includes the logic low voltage level L to the gate terminal of the first PMOS transistor PMOS1.

The first PMOS transistor PMOS1 may receive the complementary signal CTRLb including the logic low voltage level L at the gate terminal and may therefore turn on. The second PMOS transistor PMOS2 may receive the control signal CTRL including the logic high voltage level H at the gate terminal and may therefore turn off.

The first node N1 may have a same voltage level as the voltage level of the power supply voltage VCC (e.g., logic high voltage level H) applied through the source/drain terminal of the first PMOS transistor PMOS1. The second NMOS transistor NMOS2 may receive the power supply voltage VCC at the gate terminal through the first node N1 and may therefore turn on.

The second node N2 may have a same voltage level as the voltage level of the first voltage V1 (e.g., logic low voltage level L) applied through the source/drain terminal of the second NMOS transistor NMOS2. The first NMOS transistor NMOS1 may receive the first voltage V1 at the gate terminal through the second node N2 and may therefore turn off.

The third NMOS transistor NMOS3 may receive the first voltage V1 at the gate terminal through the second node N2 and may therefore turn off. The fourth NMOS transistor NMOS4 may receive the power supply voltage VCC at the gate terminal through the first node N1 and may therefore turn on.

The fourth node N4 may have a same voltage level as the voltage level of the first voltage V1 (e.g., logic low level L) applied through the source/drain terminal of the fourth NMOS transistor NMOS4. The third PMOS transistor PMOS3 may receive the first voltage V1 at the gate terminal through the fourth node N4 and may therefore turn on.

The third node N3 may have a same voltage level as the voltage level of the second voltage V2 (e.g., logic high level H) applied through the source/drain terminal of the third PMOS transistor PMOS3. The fourth PMOS transistor PMOS4 may receive the second voltage V2 at the gate terminal through the third node N3 and may therefore turn off.

The first voltage V1 may be applied to the shielding line 112 through the fourth node N4. For example, the voltage level of the shielding voltage VS applied from the shielding voltage switching circuit 115 to the shielding line 112 through the fourth node N4 may be the same as the voltage level of the first voltage V1.

In at least one embodiment, the first voltage V1 may include a negative voltage level. As the first voltage V1 may include the negative voltage level and may be applied to the shielding line 112, and the high voltage signal HV may include a positive voltage level and may be applied to the shielding line 112, a voltage level difference between the high voltage transfer line 111 and the shielding line 112 may increase. As the voltage level difference between the high voltage transfer line 111 and the shielding line 112 increases, a bridge that may be formed between the high voltage transfer line 111 and the shielding line 112 may be detected.

Referring to FIGS. 8, 11, and 12 again, the voltage level of the control signal CTRL may transition from the logic high voltage level H to the logic low voltage level L at a time point T2. In a second mode (e.g., a user mode), at the time point T2, the control signal CTRL including the logic low voltage level L may be input to the level shifter 116. The second mode (e.g., the user mode) is described hereinafter.

The inverter INV receives the control signal CTRL including the logic low voltage level L and may provide the complementary signal CTRLb including the logic high voltage level H to the gate terminal of the first PMOS transistor PMOS1, and the first PMOS transistor PMOS1 may therefore turn off.

The second PMOS transistor PMOS2 may receive the control signal CTRL including the logic low level L at the gate terminal and may therefore turn on.

The second node N2 may have a same voltage level as the power supply voltage VCC (e.g., logic low level L) applied through the source/drain terminal of the second PMOS transistor PMOS2. The first NMOS transistor NMOS1 may receive the power supply voltage VCC at the agate terminal through the second node N2 and may therefore turn on.

The first node N1 may have a same voltage level as the first voltage V1 (e.g., logic low level L) applied through the source/drain terminal of the first NMOS transistor NMOS1. The second NMOS transistor NMOS2 may receive the first voltage V1 at the gate terminal through the first node N1 and may therefore turn off.

The fourth NMOS transistor PMOS4 may receive the first voltage V1 at the gate terminal through the first node N1 and may therefore turn off. The third NMOS transistor NMOS3 may receive the power supply voltage VCC at the gate terminal through the second node N2 and may therefore turn on.

The third node N3 may have a same voltage level as the first voltage V1 (e.g., logic low level L) applied through the source/drain terminal of the third NMOS transistor NMOS3. The fourth PMOS transistor PMOS4 may receive the first voltage V1 at the gate terminal through the third node N3 and may therefore turn on.

The fourth node N4 may have a same voltage level as the second voltage V2 (e.g., logic high level H) applied through the source/drain terminal of the fourth PMOS transistor PMOS4. The third PMOS transistor PMOS3 may receive the second voltage V2 at the gate terminal through the fourth node N4 and may therefore turn off.

The second voltage V2 may be applied to the shielding line 112 through the fourth node N4. In at least one embodiment, the second voltage V2 includes a positive voltage level. In at least one embodiment, the second voltage V2 includes a voltage level that is higher than a logic voltage level applied to the logic signal line 113 and is lower than the high voltage level applied to the high voltage transfer line 111. As the second voltage V2 may include a positive voltage level and may be applied to the shielding line 112, the shielding line 112 may reduce a potential difference between the high voltage transfer line 111 and the logic signal line 113, where the high voltage signal HV is applied to the high voltage transfer line 111.

In at least one embodiment, a user uses the memory device 100 in the user mode. In at least one embodiment, the user mode occurs during the second mode. During the user mode, a potential difference between the high voltage transfer line 111 and the logic signal line 113 may he reduced by applying the second voltage V2 to the shielding line 112. Because the potential difference between the high voltage transfer line 111 and the logic signal line 113 decreases, the life expectancy of the memory device 100 may be increased.

Figure 13:
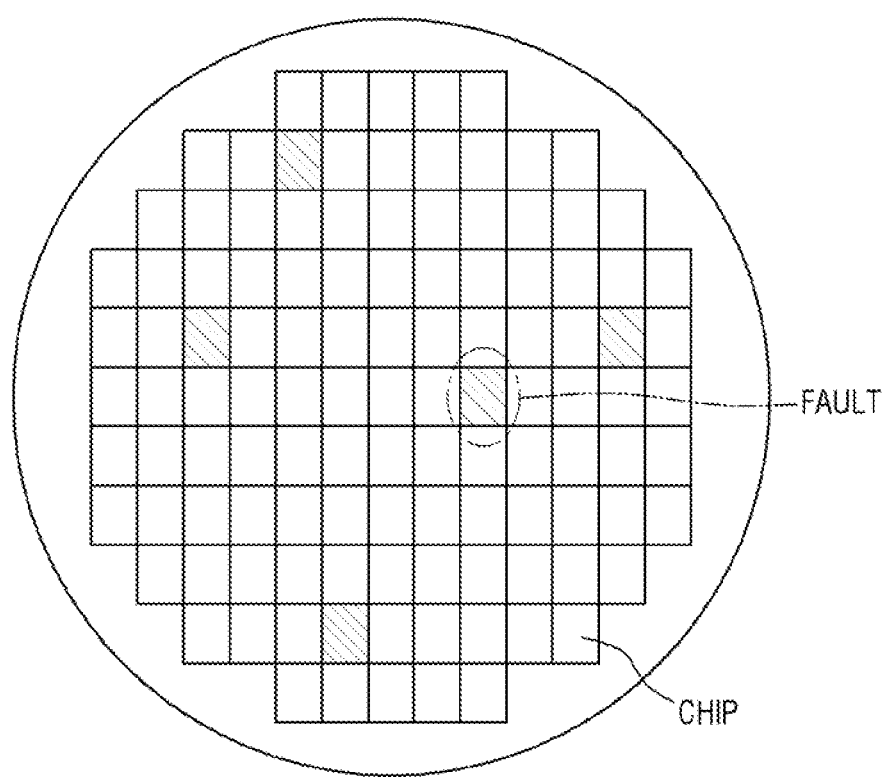
FIG. 13 is a diagram for explaining a selection process of a memory device according to at least one embodiment of the inventive concept.

FIG. 13 is a diagram for explaining a selection process of a memory device according to at least one embodiment of the inventive concept. Referring to FIGS. 10 and 13, a defective memory chip may be detected by applying the first voltage V1 including a negative voltage level to the shielding line 112. For example, by applying the first voltage V1 including the negative voltage level to the shielding line 112, a bridge (e.g., a fault) that may be formed between the high voltage transfer line 111 and the shielding line 112 may be detected.

In at least one embodiment, a bridge may be formed between the high voltage transfer line 111 and the shielding line 112 as a result of various processes. By applying the first voltage V1 including a negative voltage level, a difference in voltage level applied to the high voltage transfer line 111 and the shielding line 112 is arbitrarily maximized, and a bridge between the high voltage transfer line 111 and the shielding line 112 can be detected.

In at least one embodiment, the first mode includes a test mode for detecting a bridge between the high voltage transfer line 111 and the shielding line 112. In at least one embodiment, the test mode occurs during the first mode. During the test mode, a difference in voltage levels applied to the high voltage transfer line 111 and the shielding line 112 can be maximized by applying a first voltage V1 including a negative voltage level, thereby detecting a chip that includes a defective memory device.

While the inventive concept has been particularly shown and described with reference to embodiments thereof, it will be understood that various changes in form and details may be made therein without departing from the spirit and scope of the present disclosure.

What is claimed is:

1. A memory device comprising:
   a memory cell block connected between a common source line and a bit line and including a plurality of NAND strings, wherein the plurality of NAND strings includes a string selection transistor, a plurality of memory cells, and a ground selection transistor;
   a voltage generating circuit generating a high voltage signal, a shielding signal, and a logic signal for the memory cell block;
   a row decoder connected to the memory cell block through a word line;
   a page buffer connected to the memory cell block through the bit line;
   a peripheral circuit including a shielding signal switching circuit and a control logic circuit controlling the voltage generating circuit, the row decoder, and the page buffer;

a first wiring providing the high voltage signal to the memory cell block;
a second wiring providing the logic signal to the memory cell block; and
a third wiring providing the shielding signal to the memory cell block,
wherein the shielding signal switching circuit applies the shielding signal to the third wiring at a first voltage level in a first mode, and applies the shielding signal to the third wiring at a second voltage level different from the first voltage level in a second mode.

2. The memory device of claim 1, wherein the third wiring is arranged between the first wiring and the second wiring.

3. The memory device of claim 2, further comprising:
a fourth wiring providing the logic signal to the memory cell block; and
a fifth wiring arranged between the first wiring and the fourth wiring and providing the shielding signal to the memory cell block.

4. The memory device of claim 1, wherein a maximum voltage level of the high voltage signal is higher than a maximum voltage level of the logic signal.

5. The memory device of claim 4, wherein the first voltage level is lower than a lowest voltage level of the high voltage signal and a lowest voltage level of the logic signal.

6. The memory device of claim 5, wherein the second voltage level is lower than a highest voltage level of the high voltage signal and higher than a highest voltage level of the logic signal.

7. The memory device of claim 1, wherein the first voltage level includes a negative voltage level, and
the second voltage level includes a positive voltage level.

8. The memory device of claim 1, wherein a bridge between the first wiring and the third wiring is detected during a test mode of the first mode, and
the second mode includes a user mode wherein a potential difference between the first wiring and the second wiring is reduced by applying the second voltage level to the third wiring.

9. A memory device comprising:
a memory cell block connected between a common source line and a bit line and including a plurality of NAND strings, wherein the plurality of NAND strings includes a string selection transistor, a plurality of memory cells, and a ground selection transistor;
a voltage generating circuit generating a high voltage signal, a shielding signal, and a logic signal for the memory cell block;
a row decoder connected to the memory cell block through a word line;
a page buffer connected to the memory cell block through the bit line;
a peripheral circuit including a level shifter and a control logic circuit controlling the voltage generating circuit, the row decoder, and the page buffer;
a first wiring providing the high voltage signal to the memory cell block;
a second wiring providing the logic signal to the memory cell block; and
a third wiring providing the shielding signal to the memory cell block,
wherein the level shifter receives a first voltage including a negative voltage level, a second voltage including a positive voltage level, and a third voltage including a second positive voltage level different from the positive voltage level of the second voltage, applies the first voltage to the third wiring in response to a control signal including a first voltage level in a test mode, and applies the second voltage to the third wiring, in response to a control signal including a second voltage level in a user mode.

10. The memory device of claim 9, wherein:
the voltage generating circuit includes a first voltage terminal, a second voltage terminal, and a third voltage terminal respectively providing the first voltage, the second voltage, and the third voltage;
the level shifter includes: a first PMOS transistor and a second PMOS transistor, each connected to the third voltage terminal of the voltage generating circuit,
a first NMOS transistor connected to the first voltage terminal and to the first PMOS transistor through a first node, and
a second NMOS transistor connected to the first voltage terminal and to the second PMOS transistor through a second node;
a complementary signal of the control signal is provided to a gate terminal of the first PMOS transistor;
the control signal is provided to a gate terminal of the second PMOS transistor;
a gate terminal of the first NMOS transistor is connected to the second node; and
a gate terminal of the second NMOS transistor is connected to the first node.

11. The memory device of claim 10, wherein:
the level shifter includes:
a third PMOS transistor and a fourth PMOS transistor, each connected the second voltage terminal,
a third NMOS transistor connected to the first voltage terminal and to the third PMOS transistor through a third node, and
a fourth NMOS transistor connected to the first voltage terminal and to the fourth PMOS transistor through a fourth node;
a gate terminal of the third PMOS transistor is connected to the fourth node;
a gate terminal of the fourth PMOS transistor is connected to the third node;
a gate terminal of the third NMOS transistor is connected to the second node;
the gate terminal of the third NMOS transistor is connected to the first node; and
the fourth node is connected to the third wiring.

12. The memory device of claim 9, wherein the memory device includes a Cell-On-Peri (COP) structure in which the memory cell block and the peripheral circuit are stacked on each other.

13. The memory device of claim 9, wherein the first wiring provides the high voltage signal to the word line.

14. The memory device of claim 9, wherein a maximum voltage level of the high voltage signal is higher than a maximum voltage level of the logic signal.

15. The memory device of claim 14, wherein a voltage level of the first voltage is lower than a lowest voltage level of the high voltage signal and a lowest voltage level of the logic signal.

16. The memory device of claim 15, wherein a voltage level of the second voltage is lower than a highest voltage level of the high voltage signal and higher than a highest voltage level of the logic signal.

17. The memory device of claim 9, wherein the third wiring is arranged between the first wiring and the second wiring.

18. A method for operating a memory device, the method comprising:

providing a high voltage signal to a memory cell array including a plurality of memory cells using a first wiring;

providing a logic signal to the memory cell array using a second wiring, wherein a highest voltage level of the logic signal is lower than a highest voltage level of the high voltage signal; and providing a shielding signal to the memory cell array using a third wiring arranged between the first wiring and the second wiring, wherein the shielding signal includes a negative first voltage level in a first mode and a positive second voltage level in a second mode.

19. The method for operating the memory device of claim 18, wherein the high voltage signal is provided to the first wiring and the logic signal is provided to the second wiring when the negative first voltage level is applied to the third wiring in the first mode, and the high voltage signal is provided to the first wiring and the logic signal is provided to the second wiring when the positive second voltage level is applied to the third wiring in the second mode.

20. The method for operating the memory device of claim 18, wherein the first mode includes a test mode for detecting a bridge between the first wiring and the third wiring, and the second mode includes a user mode in which the third wiring reduces a potential difference between the first wiring and the second wiring.

* * * * *